US012660438B2

(12) United States Patent
Yoo et al.

(10) Patent No.: US 12,660,438 B2
(45) Date of Patent: Jun. 16, 2026

(54) ORGANIC LIGHT EMITTING DISPLAY PANEL

(71) Applicant: LG Display Co., Ltd., Seoul (KR)

(72) Inventors: In Sun Yoo, Paju-si (KR); Sang Bin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 690 days.

(21) Appl. No.: 17/974,115

(22) Filed: Oct. 26, 2022

(65) Prior Publication Data

US 2023/0217741 A1 Jul. 6, 2023

(30) Foreign Application Priority Data

Dec. 31, 2021 (KR) ......................... 10-2021-0194681

(51) Int. Cl.
| | |
|---|---|
| *H10K 59/131* | (2023.01) |
| *H10D 86/40* | (2025.01) |
| *H10D 86/60* | (2025.01) |
| *H10K 50/13* | (2023.01) |
| *H10K 59/121* | (2023.01) |
| *H10K 59/35* | (2023.01) |

(52) U.S. Cl.
CPC ......... *H10K 59/131* (2023.02); *H10D 86/441* (2025.01); *H10D 86/481* (2025.01); *H10D 86/60* (2025.01); *H10K 50/13* (2023.02);

*H10K 59/1213* (2023.02); *H10K 59/1216* (2023.02); *H10K 59/351* (2023.02); *H10K 59/353* (2023.02)

(58) Field of Classification Search
CPC .. H10K 59/131; H10K 50/13; H10K 59/1213; H10K 59/1216; H10K 59/351; H10K 59/353; H10K 50/16; H10K 50/17; H10D 86/441; H10D 86/481; H10D 86/60; G09G 3/3225
See application file for complete search history.

(56) References Cited

U.S. PATENT DOCUMENTS 9,425,422 B2 * 8/2016 Kim ........................ H10K 50/12

FOREIGN PATENT DOCUMENTS

KR 10-2014-0034686 A 3/2014

* cited by examiner

*Primary Examiner* — Tan N Tran
(74) *Attorney, Agent, or Firm* — Birch, Stewart, Kolasch & Birch, LLP

(57) ABSTRACT

An organic light emitting display panel capable of achieving an enhancement in brightness through addition of a white subpixel constituted by a stack structure is discussed. The organic light emitting display panel can include a plurality of data lines and a plurality of scan lines intersecting each other, and unit pixels disposed in the form of a matrix so that each of the unit pixels is disposed in a region where one scan line intersects five data lines. Each of the unit pixels can include white, red, green and blue subpixels, and the white subpixel can include three stacked emission material layers.

13 Claims, 13 Drawing Sheets

White

Red

Green

ORGANIC LIGHT EMITTING DISPLAY PANEL

CROSS-REFERENCE TO RELATED APPLICATIONS

This application claims priority to Korean Patent Application No. 10-2021-0194681 filed in the Republic of Korea on Dec. 31, 2021, the entire contents of which are hereby expressly incorporated by reference into the present application.

BACKGROUND OF THE INVENTION

Field of the Invention

The present invention relates to an organic light emitting display panel using a stack structure.

Discussion of the Related Art

Technologies associated with a display device for displaying visual information in the form of an image or a picture are being developed in information-dependent society. Among various display devices, an organic light emitting display device is being highlighted as the next-generation display.

The organic light emitting display device uses an organic light emitting diode, which is a self-luminous element configured to emit light from a emission material layer thereof through re-combination of an electron and a hole, thereby being capable of not only having characteristics such as rapid response time, high brightness, low driving voltage, and ultra-thinness, but also being implemented to have various shapes.

SUMMARY OF THE INVENTION

Accordingly, the present disclosure is directed to an organic light emitting display panel that substantially obviates one or more problems due to limitations and disadvantages of the related art.

An object of the present invention is to provide an organic light emitting display panel capable of achieving an enhancement in brightness through addition of a white subpixel constituted by a stack structure.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, an organic light emitting display panel includes a plurality of data lines and a plurality of scan lines intersecting each other, and unit pixels disposed in the form of a matrix so that each of the unit pixels is disposed in a region where one scan line intersects five data lines, wherein each of the unit pixels includes white, red, green and blue subpixels, and the white subpixel includes three stacked emission material layers.

The white subpixel can be driven by two data lines and two driving transistors.

According to an example, the white subpixel can include a first electrode, a second electrode, and a third electrode, and the first electrode, a first one of the emission material layers, the second electrode, a second one of the emission material layers, a third one of the emission material layers and the third electrode can be sequentially stacked in this order. Alternatively, the first electrode, the second emission material layer, the third emission material layer, the second electrode, the first emission material layer and the third electrode can be sequentially stacked in this order.

According to another example, the white subpixel can include a first electrode, a second electrode, and a third electrode, and a hole injection layer, a first hole transfer layer, a first one of the emission material layers and a first electron transfer layer can be sequentially stacked in this order between the first electrode and the second electrode, and a second electron transfer layer, a second one of the emission material layers, a third one of the emission material layers and a second hole transfer layer can be sequentially stacked in this order between the second electrode and the third electrode.

According to another example, the white subpixel can include a first electrode, a second electrode, and a third electrode, a hole injection layer, a first hole transfer layer, a second one of the emission material layers, a third one of the emission material layers and a first electron transfer layer can be sequentially stacked in this order between the first electrode and the second electrode, and a second electron transfer layer, a first one of the emission material layers and a second hole injection layer are sequentially stacked in this order between the second electrode and the third electrode.

The first emission material layer can be a blue emitting material layer, and the second and third emission material layers can be red and green emitting material layers, respectively, or can be green and red emitting material layers, respectively.

According to another example, the white subpixel can include a first switching transistor connected to the scan line at a gate electrode thereof while being connected to a first one of the data lines at a first electrode thereof and connected to a first node at a second electrode thereof, to be controlled by a scan pulse of the scan line, thereby transmitting a data voltage of the first data line to the first node, a first driving transistor connected to the first node at a gate electrode thereof while being connected to a high-level voltage supply line at a first electrode thereof and connected to a second node at a second electrode thereof, to control current flowing through a first light emitting diode in accordance with a voltage of the first node, a first capacitor connected between the first node and the second node, to store a data voltage supplied to the first node for one frame, a second switching transistor connected to the scan line at a gate electrode thereof while being connected to a second one of the data lines at a first electrode thereof and connected to a third node at a second electrode thereof, to be controlled by the scan pulse of the scan line, thereby transmitting a data voltage of the second data line to the third node, a second driving transistor connected to the third node at a gate electrode thereof while being connected to the high-level voltage supply line at a first electrode thereof and connected to a fourth node at a second electrode thereof, to control current flowing through second and third light emitting diodes in accordance with a voltage of the third node, and a second capacitor connected between the third node and the fourth node, to store a data voltage supplied to the third node for one frame.

The organic light emitting display panel having the above-described features in accordance with the exemplary embodiments of the present invention can have the following effects.

First, the organic light emitting display panel according to the exemplary embodiments of the present invention can achieve an enhancement in brightness because the unit pixel thereof includes a white subpixel.

Second, a blue emitting material layer is present at each of a white subpixel and a blue subpixel and, as such, a blue emitting area increases. As a result, the blue subpixel can be driven at low current and, as such, it can be possible to reduce degradation of the blue emitting element while increasing the lifespan of the blue emitting element.

Third, when a yellow image is driven through driving of a green emitting material layer and a red emitting material layer, an enhancement in brightness and an increase in lifespan of the element can be achieved.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE EMBODIMENTS

Figure 1:
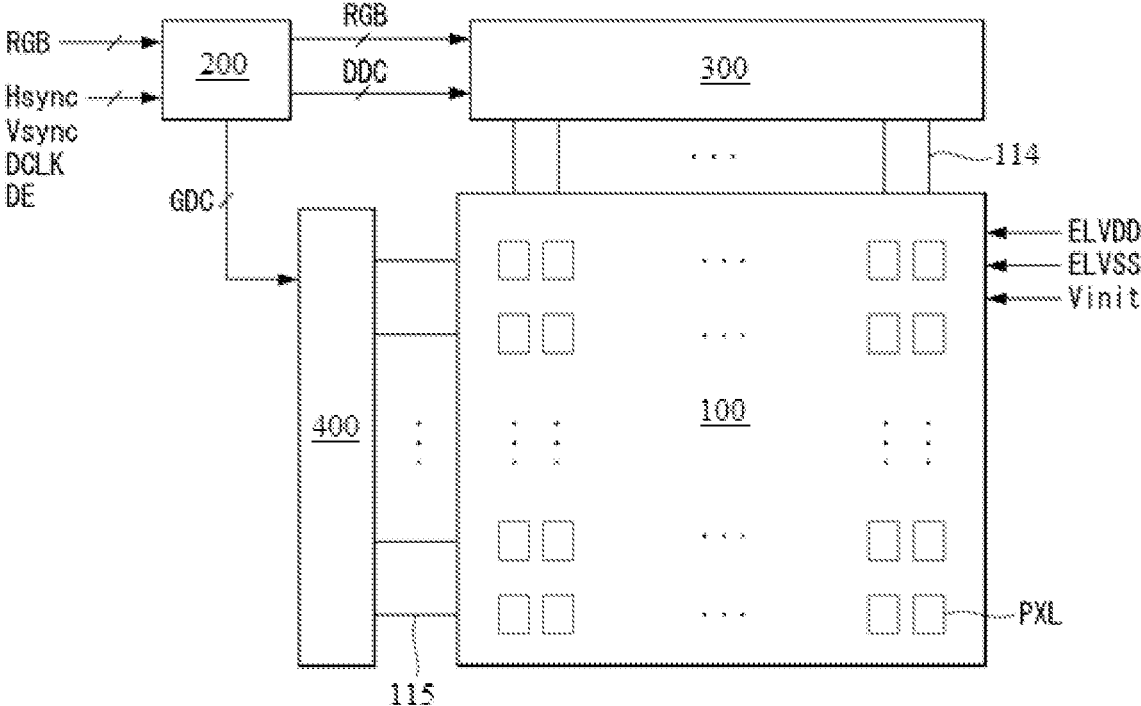
FIG. 1 is a diagram of a configuration of an organic light emitting display device according to an exemplary embodiment of the present invention.

Hereinafter, a configuration of a unit pixel of an organic light emitting display panel according to an exemplary embodiment of the present invention and a circuit of the unit pixel, which have the above-described features, will be described in detail with reference to the accompanying drawings. Throughout the specification, the same reference numerals designate substantially the same constituent elements.

Although a device, which will be described hereinafter, will be described in conjunction with an example in which the device includes an n-type thin film transistor (TFT), the device can be implemented to include a p-type TFT or a TFT having a type in which both the n type and the p type are present. The TFT can be a triple-electrode element including a gate, a source and a drain. The source is an electrode configured to supply a carrier to the transistor. The carrier in the TFT first flows from the source. The drain is an electrode from which the carrier is discharged from the TFT to an exterior of the TFT. For example, the carrier in the TFT flows from the source to the drain.

In the case of an n-type TFT, a source voltage has a lower level than a drain voltage so that an electron can flow from a source to a drain because the electron is a carrier. In the n-type TFT, current flows from the drain to the source because the electron flows from the source to the drain. Conversely, in the case of a p-type TFT, a source voltage has a higher level than a drain voltage so that a hole can flow from a source to a drain because the hole is a carrier. In the p-type TFT, current flows from the source to the drain because the hole flows from the source to the drain. In a TFT, however, a source and a drain can be interchanged in accordance with voltages applied thereto. Taking into consideration such conditions, one of the source and the drain will be referred to as a "first electrode", and the other of the source and the drain will be referred to as a "second electrode".

Further, all the components of each organic light emitting display device according to all embodiments of the present invention are operatively coupled and configured.

FIG. 1 is a diagram of a configuration of an organic light emitting display device according to an exemplary embodiment of the present invention.

Referring to FIG. 1, the organic light emitting display device according to the exemplary embodiment of the present invention includes a display panel 100 formed with unit pixels PXL, a data driving circuit 300 configured to drive data lines 114, a gate driving circuit 400 configured to drive scan lines 115, and a timing controller 200 configured to control driving timings of the data driving circuit 300 and the gate driving circuit 400.

A plurality of data lines 114 and a plurality of scan lines 115 intersect each other at the display panel 100. The unit pixels PXL are disposed in the form of a matrix so that each unit pixel PXL is disposed in a region where one scan line 115 intersects five data lines 114. The unit pixels disposed on the same horizontal line constitute one pixel row. The unit pixels disposed in one pixel row are connected to the one scan line 115, and the one scan line 115 can include one or more scan lines and one or more light emission lines.

For example, each unit pixel can be connected to five data lines 114, one or more scan lines, and one or more light emission lines. The unit pixels can receive, in common, high-level and low-level driving voltages VDD and VSS from a power generator. A detailed configuration will be described later.

TFTs constituting one unit pixel can be implemented as an oxide TFT including an oxide semiconductor layer. The oxide TFT is advantageous in terms of enlargement of the display panel 100, taking into consideration all of electron mobility, process deviation and the like. Of course, the exemplary embodiments of the present invention are not limited to the above-described condition, and the semiconductor layer of the TFT can be formed of amorphous silicon, polysilicon or the like.

Each unit pixel is constituted by four subpixels, and the subpixels can be configured to emit white, red, green and blue light, respectively.

Among the four subpixels constituting one unit pixel, the white subpixel has a multi-stack structure in which red, green, and blue emitting material layers are stacked. A concrete configuration will be described later.

The timing controller 200 rearranges digital video data RGB input from an exterior thereof in conformity with a resolution of the display panel 100, and supplies the rearranged digital video data RGB to the data driving circuit 300. In addition, the timing controller 200 generates a data control signal DDC for control of an operation timing of the data driving circuit 300 and a gate control signal GDC for control of an operation timing of the gate driving circuit 400 based on timing signals such as a vertical synchronization signal Vsync, a horizontal synchronization signal Hsync, a dot clock signal DCLK, and a data enable signal DE.

The data driving circuit 300 converts the digital video data RGB input from the timing controller 200 into an analog data voltage based on the data control signal DDC.

The gate driving circuit 400 can generate a scan signal and an emission control signal based on the gate control signal GDC. The gate driving circuit 400 can include a scan driver and an emission driver. The scan driver can generate a scan signal in a row-sequential manner in order to drive one or more scan lines connected to each pixel row, and can supply the scan signal to the scan lines. The emission driver can generate an emission signal in a row-sequential manner in order to drive one or more emission lines connected to each pixel row, and can supply the emission signal to the emission lines.

The gate driving circuit 400 as described above can be directly formed in a non-display area of the display panel 100 in a gate-driver-in-panel (GIP) manner.

Figure 2:
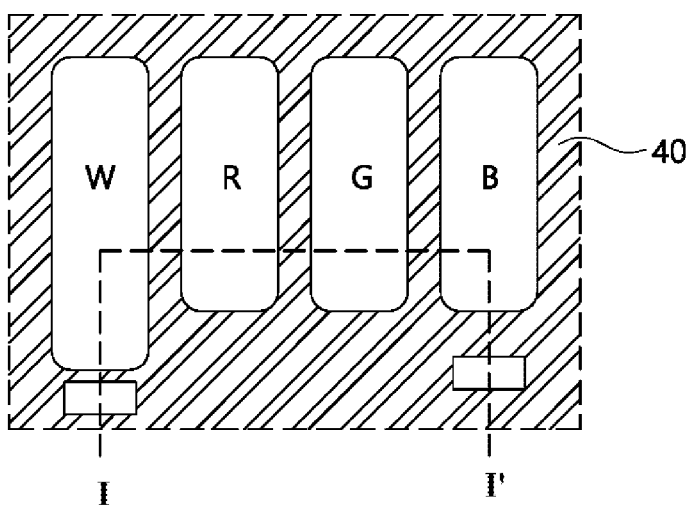
FIG. 2 is a plan view of a unit pixel of an organic light emitting display panel according to a first embodiment of the present invention.
Figure 3:
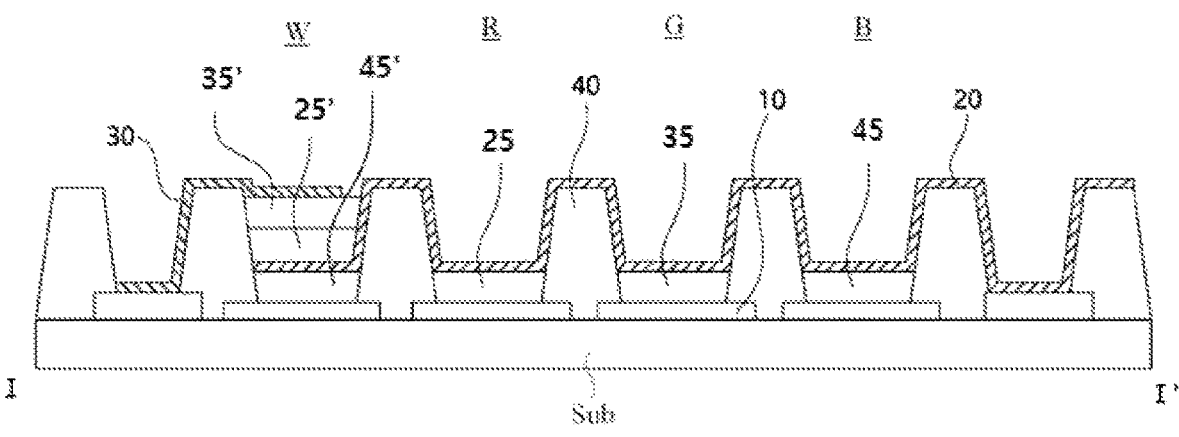
FIG. 3 is a schematic cross-sectional view of the unit pixel of the organic light emitting display panel, taken along line I-I' in FIG. 2 according to the first embodiment of the present invention.

FIG. 2 is a plan view of a stripe type unit pixel of an organic light emitting display panel according to a first embodiment of the present invention. FIG. 3 is a schematic cross-sectional view of the unit pixel of the organic light emitting display panel, taken along line I-I' in FIG. 2 according to the first embodiment of the present invention.

As shown in FIG. 2, the unit pixel of the organic light emitting display panel according to the first embodiment of the present invention includes four subpixels W, R, G and B of white, red, green and blue aligned with one another, and a bank layer 40 disposed at boundary portions of the subpixels W, R, G and B while having the form of a lattice so that the bank layer 40 surrounds the subpixels W, R, G and B.

As shown in FIG. 3, first electrodes 10 respectively corresponding to the white, red, green and blue subpixels W, R, G and B are disposed on a substrate Sub, and the bank layer 40 is formed at the boundary portions of the four white, red, green and blue pixels W, R, G and B.

In this case, the first electrodes 10 of the four white, red, green and blue pixels W, R, G and B are driven by driving transistors, respectively, and a third electrode 30 of the white subpixel W is driven by another driving transistor.

Although the first electrode 10 is shown in FIG. 3 as being disposed on the substrate Sub, this is only schematic, and a detailed configuration under the first electrode 10 will be described later with reference to FIG. 10.

In the red subpixel R, an organic material layer 25 configured to emit red light is disposed between the first electrode 10 and a second electrode 20. For example, the organic material layer 25 can include a hole injection layer HIL, a hole transfer layer HTL, a red emitting material layer R-EML, and an electron transfer layer ETL.

In the green subpixel G, an organic material layer 35 configured to emit green light is disposed between the first electrode 10 and the second electrode 20. For example, the organic material layer 35 can include a hole injection layer HIL, a hole transfer layer HTL, a green emitting material layer G-EML, and an electron transfer layer ETL.

In the blue subpixel B, an organic material layer 45 configured to emit blue light is disposed between the first electrode 10 and the second electrode 20. For example, the organic material layer 45 can include a hole injection layer HIL, a hole transfer layer HTL, a blue emitting material layer B-EML, and an electron transfer layer ETL.

In the white subpixel W, an organic material layer 45' configured to emit blue light is disposed between the first electrode 10 and the second electrode 20, and an organic material layer 25' configured to emit red light and an organic material layer 35' configured to emit green light are disposed between the second electrode 20 and the third electrode 30.

For example, the organic material layer 45' can include a hole injection layer HIL, a hole transfer layer HTL, a blue emitting material layer B-EML and an electron transfer layer ETL, the organic material layer 25' can include an electron transfer layer ETL and a red emitting material layer R-EML, and the organic material layer 35' can include a green emitting material layer G-EML and a hole transfer layer HTL.

In this case, a part of the organic material layers 25, 35, 45, 25', 35' and 45' can be formed through inkjet printing, whereas the remaining part of the organic material layers 25, 35, 45, 25', 35' and 45' and the first to third electrodes 10, 20 and 30 can be formed by a deposition process. A detailed description will be given later.

Figure 4:
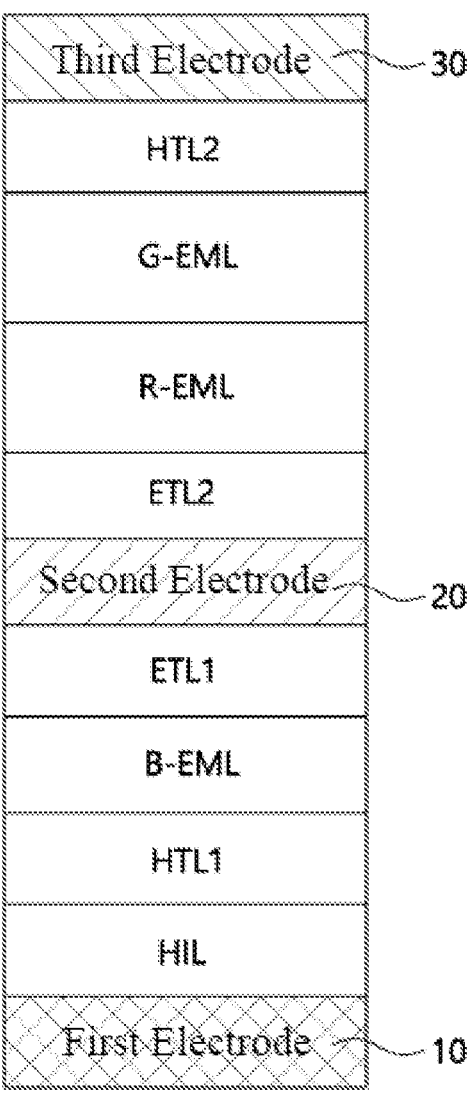
FIG. 4 is a view of a concrete configuration of a light emitting element of the white subpixel of the organic light emitting display panel according to the first embodiment of the present invention.

FIG. 4 is a view of a concrete configuration of a light emitting element of the white subpixel of the organic light emitting display panel according to the first embodiment of the present invention.

As shown in FIG. 4, the light emitting element of the white subpixel of the organic light emitting display panel according to the first embodiment of the present invention can have a structure in which a first electrode 10, a hole injection layer HIL, a first hole transfer layer HTL1, a blue emitting material layer B-EML, a first electron transfer layer ETL1, a second electrode 20, a second electron transfer layer ETL2, a red emitting material layer R-EML, a green emitting material layer G-EML, a second hole transfer layer HTL2, and a third electrode 30 are sequentially stacked in this order.

Although the green emitting material layer G-EML is shown as being disposed on the red emitting material layer R-EML between the second electrode 20 and the third electrode 30, the exemplary embodiments of the present invention are not limited thereto, and the red emitting material layer R-EML can be disposed on the green emitting material layer G-EML.

Since the white subpixel has the structure as shown in FIG. 4, all of the blue emitting material layer B-EML, the red emitting material layer R-EML and the green emitting material layer G-EML emit light when a negative (−) voltage is applied to the second electrode 20, and a positive (+) voltage is applied to the first and third electrodes 10 and 30. Accordingly, white light is emitted from the white subpixel.

Figure 5:
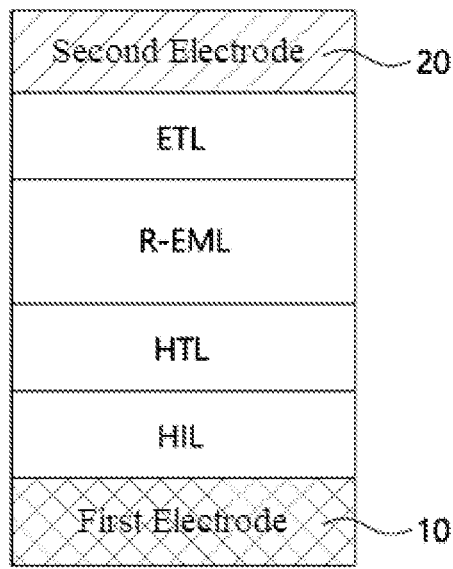
FIG. 5 is view of a concrete configuration of a light emitting element of the red subpixel of the organic light emitting display panel according to the first embodiment of the present invention.

FIG. 5 is view of a concrete configuration of a light emitting element of the red subpixel of the organic light emitting display panel according to the first embodiment of the present invention.

As shown in FIG. 5, the light emitting element of the red subpixel of the organic light emitting display panel according to the first embodiment of the present invention can have a structure in which a first electrode 10, a hole injection layer HIL, a hole transfer layer HTL, a red emitting material layer R-EML, an electron transfer layer ETL, and a second electrode 20 are sequentially stacked in this order.

Figure 6:
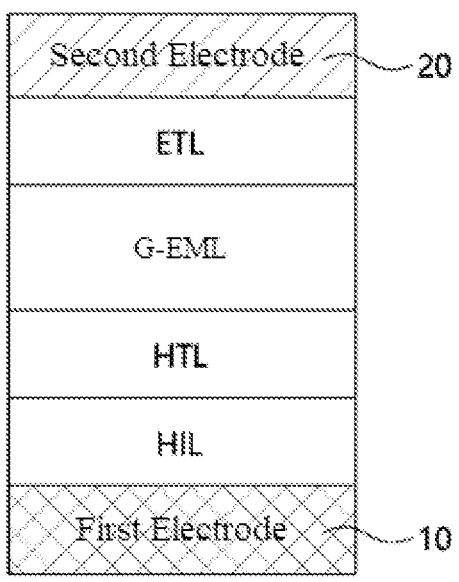
FIG. 6 is view of a concrete configuration of a light emitting element of the green subpixel of the organic light emitting display panel according to the first embodiment of the present invention.

FIG. 6 is view of a concrete configuration of a light emitting element of the green subpixel of the organic light emitting display panel according to the first embodiment of the present invention.

As shown in FIG. 6, the light emitting element of the green subpixel of the organic light emitting display panel according to the first embodiment of the present invention can have a structure in which a first electrode 10, a hole injection layer HIL, a hole transfer layer HTL, a green emitting material layer G-EML, an electron transfer layer ETL, and a second electrode 20 are sequentially stacked in this order.

Figure 7:
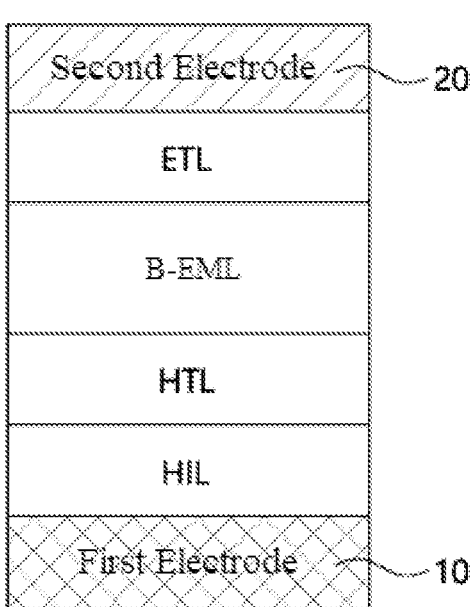
FIG. 7 is view of a concrete configuration of a light emitting element of the blue subpixel of the organic light emitting display panel according to the first embodiment of the present invention.

FIG. 7 is view of a concrete configuration of a light emitting element of the blue subpixel of the organic light emitting display panel according to the first embodiment of the present invention.

As shown in FIG. 7, the light emitting element of the blue subpixel of the organic light emitting display panel according to the first embodiment of the present invention can have a structure in which a first electrode 10, a hole injection layer HIL, a hole transfer layer HTL, a blue emitting material layer B-EML, an electron transfer layer ETL, and a second electrode 20 are sequentially stacked in this order.

Figure 8:
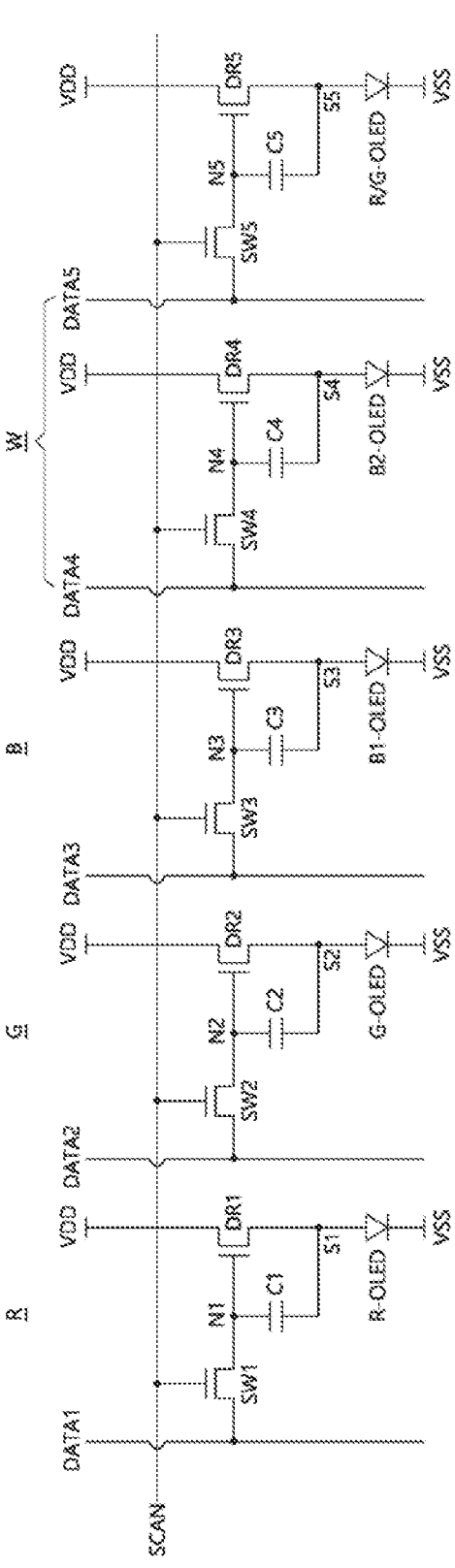
FIG. 8 is a circuit diagram of a circuit configuration of one unit pixel of the organic light emitting display panel according to the first embodiment of the present invention.

FIG. 8 is a circuit diagram of a circuit configuration of one unit pixel of the organic light emitting display panel according to the first embodiment of the present invention.

Particularly, FIG. 8 shows that the unit pixel according to the first embodiment of the present invention is constituted by a red light emitting diode R-OLED, a green light emitting diode G-OLED, first and second blue light emitting diodes B1-OLED and B2-OLED, and an red/green (R/G) light emitting diode R/G-OLED.

For example, a light emitting element, which is constituted by the first electrode 10, the hole injection layer HIL, the hole transfer layer HTL, the red emitting material layer R-EML, the electron transfer layer ETL and the second electrode 20 shown in FIG. 5, is indicated as the red light emitting diode R-OLED.

A light emitting element, which is constituted by the first electrode 10, the hole injection layer HIL, the hole transfer layer HTL, the green emitting material layer G-EML, the electron transfer layer ETL and the second electrode 20 shown in FIG. 6, is indicated as the green light emitting diode G-OLED.

Further, a light emitting element, which is constituted by the first electrode 10, the hole injection layer HIL, the hole transfer layer HTL, the blue emitting material layer B-EML, the electron transfer layer ETL and the second electrode 20 shown in FIG. 7, is indicated as the first blue light emitting diode B1-OLED.

In addition, a light emitting element, which is constituted by the first electrode 10, the hole injection layer HIL, the first hole transfer layer HTL1, the blue emitting material layer B-EML, the first electron transfer layer ETL1 and the second electrode 20 shown in FIG. 4, is indicated as the second blue light emitting diode B2-OLED. A light emitting element, which is constituted by the second electrode 20, the second electron transfer layer ETL2, the red emitting material layer R-EML, the green emitting material layer G-EML, the second hole transfer layer HTL2 and the third electrode 30 shown in FIG. 4, is also indicated as the red/green light emitting diode R/G-OLED.

The unit pixel of the organic light emitting display panel according to the exemplary embodiments of the present invention can be driven by one scan line SCAN and five data lines DATA1, DATA2, DATA3, DATA 4 and DATA 5, as shown in FIG. 8.

A red subpixel, a green subpixel and a blue subpixel can be driven by the data lines DATA1, DATA 2 and DATA3, respectively, and a white subpixel can be driven by the remaining two data lines DATA4 and DATA5.

Hereinafter, a configuration of a unit pixel circuit configured to selectively drive the light emitting diodes R-OLED, G-OLED, B1-OLED, B2-OLED and R/G-OLED configured as described above will be described.

The unit pixel circuit configured to selectively drive the light emitting diodes R-OLED, G-OLED, B1-OLED, B2-OLED and R/G-OLED includes first to fifth switching transistors SW1 to SW5, first to fifth driving transistors DR1 to DR5, and first to fifth capacitors C1 to C5.

The first switching transistor SW1 is connected to a scan line SCAN at a gate electrode thereof while being connected to the first data line DATA1 at a first electrode thereof and connected to a node n1 at a second electrode thereof and, as such, is controlled by a scan pulse of the scan line SCAN, thereby transmitting a data voltage of the first data line DATA1 to the node n1.

The second switching transistor SW2 is connected to the scan line SCAN at a gate electrode thereof while being connected to the second data line DATA2 at a first electrode thereof and connected to a node n2 at a second electrode thereof and, as such, is controlled by the scan pulse of the scan line SCAN, thereby transmitting a data voltage of the second data line DATA2 to the node n2.

The third switching transistor SW3 is connected to the scan line SCAN at a gate electrode thereof while being connected to the third data line DATA3 at a first electrode thereof and connected to a node n3 at a second electrode thereof and, as such, is controlled by the scan pulse of the scan line SCAN, thereby transmitting a data voltage of the third data line DATA3 to the node n3.

The fourth switching transistor SW4 is connected to the scan line SCAN at a gate electrode thereof while being connected to the fourth data line DATA4 at a first electrode thereof and connected to a node n4 at a second electrode thereof and, as such, is controlled by the scan pulse of the scan line SCAN, thereby transmitting a data voltage of the fourth data line DATA4 to the node n4.

The fifth switching transistor SW5 is connected to the scan line SCAN at a gate electrode thereof while being connected to the fifth data line DATA5 at a first electrode thereof and connected to a node n5 at a second electrode thereof and, as such, is controlled by the scan pulse of the scan line SCAN, thereby transmitting a data voltage of the fifth data line DATA5 to the node n5.

The first driving transistor DR1 is connected to the node n1 at a gate electrode thereof while being connected to a high-level voltage (VDD) supply line at a first electrode thereof and connected to a node s1 at a second electrode thereof and, as such, controls current flowing through the red light emitting diode R-OLED in accordance with a voltage of the node n1.

The second driving transistor DR2 is connected to the node n2 at a gate electrode thereof while being connected to the high-level voltage (VDD) supply line at a first electrode thereof and connected to a node s2 at a second electrode thereof and, as such, controls current flowing through the green light emitting diode G-OLED in accordance with a voltage of the node n2.

The third driving transistor DR3 is connected to the node n3 at a gate electrode thereof while being connected to the high-level voltage (VDD) supply line at a first electrode thereof and connected to a node s3 at a second electrode thereof and, as such, controls current flowing through the first blue light emitting diode B1-OLED in accordance with a voltage of the node n3.

The fourth driving transistor DR4 is connected to the node n4 at a gate electrode thereof while being connected to the high-level voltage (VDD) supply line at a first electrode thereof and connected to a node s4 at a second electrode thereof and, as such, controls current flowing through the second blue light emitting diode B2-OLED in accordance with a voltage of the node n4.

The fifth driving transistor DR5 is connected to the node n5 at a gate electrode thereof while being connected to the high-level voltage (VDD) supply line at a first electrode thereof and connected to a node s5 at a second electrode thereof and, as such, controls current flowing through the red/green light emitting diode R/G-OLED in accordance with a voltage of the node n5.

The first capacitor C1 is connected between the node n1 and the node s1 and, as such, stores a data voltage supplied to the node n1 for one frame.

The second capacitor C2 is connected between the node n2 and the node s2 and, as such, stores a data voltage supplied to the node n2 for one frame.

The third capacitor C3 is connected between the node n3 and the node s3 and, as such, stores a data voltage supplied to the node n3 for one frame.

The fourth capacitor C4 is connected between the node n4 and the node s4 and, as such, stores a data voltage supplied to the node n4 for one frame.

The fifth capacitor C5 is connected between the node n5 and the node s5 and, as such, stores a data voltage supplied to the node n5 for one frame.

The red light emitting diode R-OLED is connected between the node s1 and a low-level voltage (VSS) supply line, and the green light emitting diode G-OLED is connected between the node s2 and the low-level voltage (VSS) supply line.

The first blue light emitting diode B1-OLED is connected between the node s3 and the low-level voltage (VSS) supply line, the second blue light emitting diode B2-OLED is connected between the node s4 and the low-level voltage (VSS) supply line, and the red/green light emitting diode R/G-OLED is connected between the node s5 and the low-level voltage (VSS) supply line.

Next, operation of the unit pixel of the organic light emitting display device according to the first embodiment of the present invention configured as described above will be described.

In the unit pixel circuit of FIG. 8, when a scan pulse is supplied to the scan line SCAN, and a data signal is supplied to each of the first to fifth data lines DATA1, DATA2, DATA3, DATA4 and DATA5, for one frame, the red light emitting diode R-OLED of the red subpixel, the green light emitting diode G-OLED of the green subpixel, the first blue light emitting diode B1-OLED of the blue subpixel, and the second blue light emitting diode B2-OLED and the red/green light emitting diode R/G-OLED of the white subpixel emit light, thereby displaying an image.

Hereinafter, layout and cross-sectional structures of the unit pixel according to the first embodiment of the present invention having the above-described circuit configuration will be described in detail.

Figure 9:
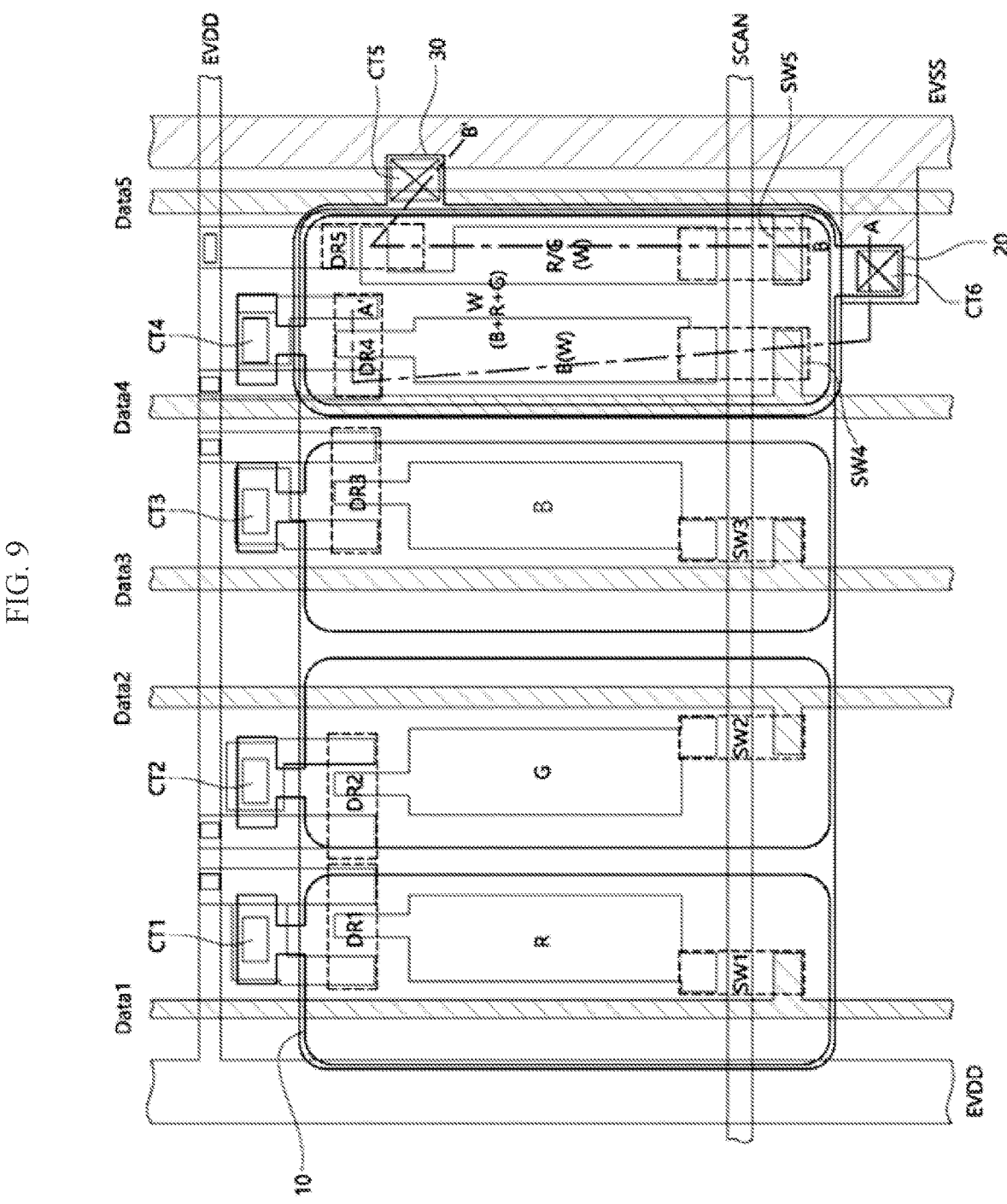
FIG. 9 is a concrete layout view of the unit pixel according to the first embodiment of the present invention.

FIG. 9 is a concrete layout view of the unit pixel according to the first embodiment of the present invention.

The unit pixel according to the first embodiment of the present invention includes four subpixels including red, green, blue and white subpixels R, G, B and W. As shown in FIG. 9, the unit pixel according to the embodiment of the present invention is constituted by one scan line SCAN, five data lines Data1, Data2, Data3, Data4 and Data5, a high-level voltage supply line EVDD, and a low-level voltage supply line EVSS.

As shown in FIG. 9, a first electrode 10 is independently disposed at each of the red, green, blue and white subpixels R, G, B and W, a second electrode 20 is integrally disposed at the red, green, blue and white subpixels R, G, B and W, and a third electrode 30 is disposed only at the white subpixel W.

The first electrode 10, the second electrode 20 and the third electrode 30 are sequentially stacked, as described with reference to FIGS. 3 and 4.

The high-level voltage supply line EVDD shown in FIG. 9 is a power line for applying a voltage to the first electrode 10 and the third electrode 30 shown in FIGS. 3 and 4, and the low-level voltage supply line EVSS is a power line for applying a voltage to the second electrode 20 shown in FIGS. 3 and 4 and FIGS. 6 to 8.

A first switching transistor SW1 is disposed in a region where the scan line SCAN and the first data line Data1 intersect each other, a second switching transistor SW2 is disposed in a region where the scan line SCAN and the second data line Data2 intersect each other, and a third switching transistor SW3 is disposed in a region where the scan line SCAN and the third data line Data3 intersect each other.

In addition, a fourth switching transistor SW4 is disposed in a region where the scan line SCAN and the fourth data line Data4 intersect each other, and a fifth switching transistor SW5 is disposed in a region where the scan line SCAN and the fifth data line Data5 intersect each other.

In the case of the first switching transistor SW1, a gate electrode thereof is connected to the scan line SCAN, a first electrode thereof protrudes from the first data line Data1, and a second electrode thereof extends in a longitudinal direction of the first data line Data1 adjacent to the first data line Data1.

In the case of the second switching transistor SW2, a gate electrode thereof is connected to the scan line SCAN, a first electrode thereof protrudes from the second data line Data2, and a second electrode thereof extends in a longitudinal direction of the second data line Data2 adjacent to the second data line Data2.

In the case of the third switching transistor SW3, a gate electrode thereof is connected to the scan line SCAN, a first electrode thereof protrudes from the third data line Data3, and a second electrode thereof extends in a longitudinal direction of the third data line Data3 adjacent to the third data line Data3.

In the case of the fourth switching transistor SW4, a gate electrode thereof is connected to the scan line SCAN, a first electrode thereof protrudes from the fourth data line Data4, and a second electrode thereof extends in a longitudinal direction of the fourth data line Data4 adjacent to the fourth data line Data4.

In the case of the fifth switching transistor SW5, a gate electrode thereof is connected to the scan line SCAN, a first electrode thereof protrudes from the fifth data line Data5, and a second electrode thereof extends in a longitudinal direction of the fifth data line Data5 adjacent to the fifth data line Data5.

The first to third switching transistors SW1 to SW3 are disposed at the red, green and blue subpixels R, G and B, respectively, and all of the fourth and fifth switching transistors SW4 and SW5 are disposed at the white subpixel W.

First to fifth driving transistors DR1, DR2, DR3, DR4 and DR5 are disposed in a region opposite to that of the first to fifth switching transistors SW1, SW2, SW3, SW4 and SW5 adjacent to the high-level voltage supply line EVDD.

In the case of the first driving transistor DR1, a gate electrode thereof is formed to be integrated with the second electrode of the first switching transistor SW1, a first electrode thereof is connected to the high-level voltage supply line EVDD, and a second electrode thereof is connected to the first electrode 10 of the red subpixel R.

In the case of the second driving transistor DR2, a gate electrode thereof is formed to be integrated with the second electrode of the second switching transistor SW2, a first electrode thereof is connected to the high-level voltage supply line EVDD, and a second electrode thereof is connected to the first electrode 10 of the green subpixel G.

In the case of the third driving transistor DR3, a gate electrode thereof is formed to be integrated with the second electrode of the third switching transistor SW3, a first electrode thereof is connected to the high-level voltage supply line EVDD, and a second electrode thereof is connected to the first electrode 10 of the blue subpixel B.

In the case of the fourth driving transistor DR4, a gate electrode thereof is formed to be integrated with the second electrode of the fourth switching transistor SW4, a first electrode thereof is connected to the high-level voltage supply line EVDD, and a second electrode thereof is connected to the first electrode 10 of the white subpixel W.

In the case of the fifth driving transistor DR5, a gate electrode thereof is formed to be integrated with the second electrode of the fifth switching transistor SW5, a first electrode thereof is connected to the high-level voltage supply line EVDD, and a second electrode thereof is connected to the third electrode 30 of the white subpixel W.

For example, the second electrodes of the first to fourth driving transistors DR1 to DR4 are connected to the first electrodes 10 of the corresponding subpixels via first to fourth contact holes CT1 to CT4, respectively, and the second electrode of the fifth driving transistor DR5 is connected to the third electrode 30 of the white subpixel W via a fifth contact hole CT5.

The second electrode 20 is connected to the low-level voltage supply line EVSS via a sixth contact hole CT6.

An organic material layer 25 emitting red light as described with reference to FIG. 3 is disposed between the first electrode 10 and the second electrode 20 at the red subpixel R, an organic material layer 35 emitting green light as described with reference to FIG. 3 is disposed between the first electrode 10 and the second electrode 20 at the green subpixel G, and an organic material layer 45 emitting blue light as described with reference to FIG. 3 is disposed between the first electrode 10 and the second electrode 20 at the blue subpixel B.

Similarly, at the white subpixel W, an organic material layer 45' emitting blue light as described with reference to FIG. 3 is disposed between the first electrode 10 and the second electrode 20, and an organic material layer 25' emitting red light and an organic material 35' emitting green light as described with reference to FIG. 3 are disposed between the second electrode 20 and the third electrode 30.

Hereinafter, a concrete structure of the white subpixel of the organic light emitting display panel according to the exemplary embodiment of the present invention having the above-described configuration will be described.

Figure 10:
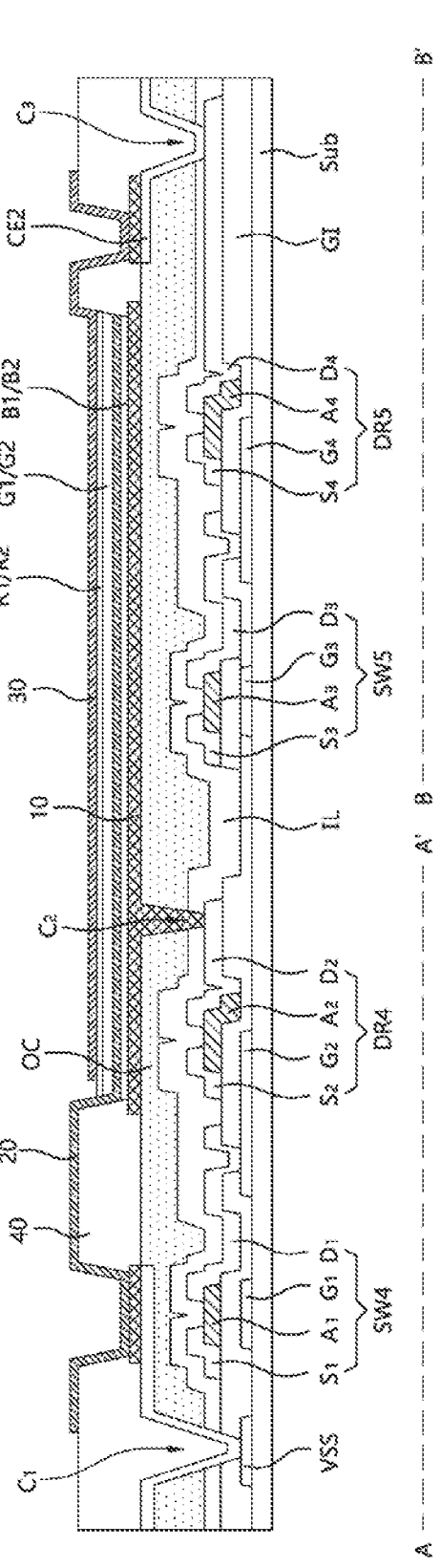
FIG. 10 is a view of a concrete cross-sectional structure of a white subpixel, taken along lines A-A' and B-B' in FIG. 9 according to an exemplary embodiment of the present invention.

FIG. 10 is a view of a concrete cross-sectional structure of a white subpixel according to an exemplary embodiment of the present invention taken along lines A-A' and B-B' in FIG. 9.

A plurality of gate electrodes G1, G2, G3 and G4 is formed on a substrate Sub, and a gate insulating layer G1 is formed on the entire surface of the substrate Sub including the plurality of gate electrodes G1, G2, G3 and G4.

A plurality of active layers A1, A2, A3 and A4 is formed on the gate insulating layer G1, to overlap with the plurality of gate electrodes G1, G2, G3 and G4, respectively, and a plurality of source electrodes S1, S2, S3 and S4 and a plurality of drain electrodes D1, D2, D3 and D4 are formed at opposite sides of the plurality of active layers A1, A2, A3 and A4, respectively.

An interlayer insulating layer IL and an overcoat layer OC are formed on the entire surface of the gate insulating layer G1 formed with the plurality of active layers A1, A2, A3 and A4, the plurality of source electrodes S1, S2, S3 and S4 and the plurality of drain electrodes D1, D2, D3 and D4.

In this case, a fourth switching transistor SW4 shown in FIG. 10 is constituted by the gate electrode G1, the active layer A1, the source electrode S1 and the drain electrode D1.

A fourth driving transistor DR4 shown in FIG. 10 is constituted by the gate electrode G2, the active layer A2, the source electrode S2 and the drain electrode D2.

A fifth switching transistor SW5 shown in FIG. 10 is constituted by the gate electrode G3, the active layer A3, the source electrode S3 and the drain electrode D3.

A fifth driving transistor DR5 shown in FIG. 10 is constituted by the gate electrode G4, the active layer A4, the source electrode S4 and the drain electrode D4.

Accordingly, the drain electrode D1 of the fourth switching transistor SW4 is electrically connected to the gate electrode G2 of the fourth driving transistor DR4, and the drain electrode D3 of the fifth switching transistor SW5 is electrically connected to the gate electrode G4 of the fifth driving transistor DR5.

In addition, a first electrode 10, a blue emitting material layer B-EML, a second electrode 20, a red emitting material layer R-EML, a green emitting material layer G-EML, and a third electrode 30 are sequentially stacked on the overcoat layer OC in this order, as described with reference to FIG. 3.

A contact hole C2 is formed at the interlayer insulating layer IL and the overcoat layer OC, to expose the drain electrode D2 of the fourth driving transistor DR4, and, as such, the first electrode 10 is electrically connected to the drain electrode D2 of the fourth driving transistor DR4.

A contact hole C3 is formed at the interlayer insulating layer IL and the overcoat layer OC, to expose the drain electrode D4 of the fifth driving transistor DR5, and, as such, the third electrode 30 is electrically connected to the drain electrode D4 of the fifth driving transistor DR5.

In addition, a contact hole C1 is formed at the interlayer insulating layer IL and the overcoat layer OC, to expose a low-level voltage (VSS) supply line, and, as such, the second electrode 20 is electrically connected to the low-level voltage (VSS) supply line.

FIG. 10 shows that the second electrode 20 is electrically connected to the low-level voltage (VSS) supply line through stacking of materials of a connecting electrode CE1 and the first electrode 10, and the third electrode 30 is electrically connected to the drain electrode D4 of the fifth driving transistor DR5 through stacking of materials of a connecting electrode CE2 and the first electrode 10.

In addition, a bank layer 40 defining a subpixel region is formed on the overcoat layer OC in a non-emission region of each subpixel.

Referring to FIG. 8, the gate electrode G1 of the fourth switching transistor SW4 can be electrically connected to a scan line SCAN or can be formed to be integrated with the scan line SCAN, and the source electrode S1 of the fourth switching transistor SW4 can be electrically connected to a fourth data line Data4 or can be formed to be integrated with the fourth data line Data4.

The source electrode S2 of the fourth driving transistor DR4 can be electrically connected to a high-level voltage (VDD) supply line.

The gate electrode G3 of the fifth switching transistor SW5 can be electrically connected to the scan line SCAN or can be formed to be integrated with the scan line SCAN, and the source electrode S3 of the fifth switching transistor SW5 can be electrically connected to a fifth data line Data5 or can be formed to be integrated with the fifth data line Data5.

The source electrode S4 of the fifth driving transistor DR5 can be electrically connected to the high-level voltage (VDD) supply line.

Hereinafter, a method for manufacturing the organic light emitting display panel according to the first embodiment of the present invention having the above-described configuration will be described.

FIGS. 11A to 11F are cross-sectional views of a process for manufacturing the organic light emitting display panel, taken along line I-I in FIG. 2 according to the first embodiment of the present invention.

Figure 11A:
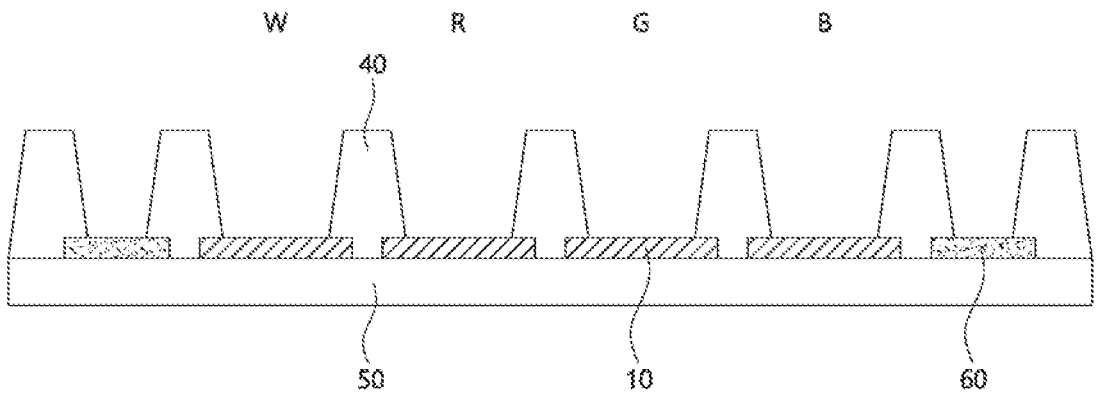
FIGS. 11A to 11F are cross-sectional views of a process for manufacturing the organic light emitting display panel, taken along line I-I' in FIG. 2 according to the first embodiment of the present invention.

As shown in FIG. 11A, first electrodes 10 are formed in white, red, green and blue subpixel regions, respectively, on a substrate 50, and a power supply line 60 is formed on a peripheral portion of the substrate 50.

Here, the first electrode 10 can be made of a transparent conductive material, for example, indium-tin-oxide (ITO) or indium-zinc-oxide (IZO), and the power supply line 60 can be made of a metal material.

Subsequently, a polyimide type polymer or a carbon compound coated with hydrocarbon or the like is deposited on the substrate 50 formed with the first electrode 10 and the power supply line 60, and is then selectively removed, thereby forming a bank layer 40 having the form of a lattice in boundary portions of the subpixel regions.

Figure 11B:
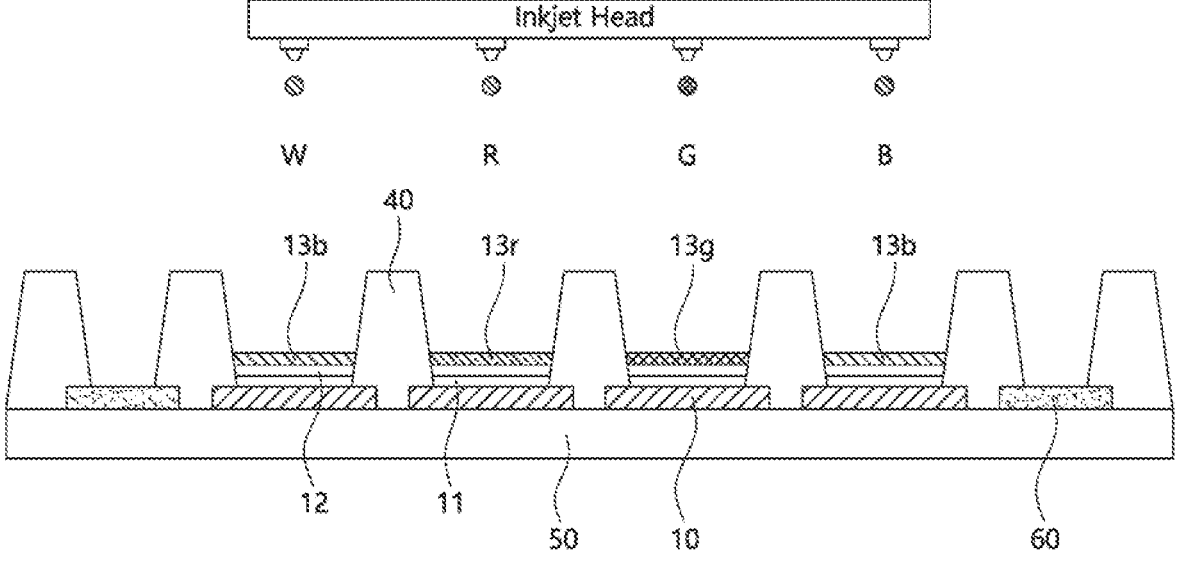

As shown in FIG. 11B, a hole injection layer 11 is then formed on the first electrode 10 by dropping a hole injection emission material solution onto the first electrode 10 in each subpixel region through inkjet printing, and then evaporating a solvent of the dropped hole injection emission material solution through drying of the dropped hole injection emission material solution so that only a solute of the hole injection emission material solution remains on the first electrode 10.

A hole transfer layer 12 is then formed on the hole injection layer 11 by dropping a hole transfer emission material solution onto the hole injection layer 11 in each subpixel region through inkjet printing, and then evaporating a solvent of the dropped hole transfer emission material solution through drying of the dropped hole transfer emission material solution so that only a solute of the hole transfer emission material solution remains on the hole injection layer 11.

Subsequently, emission material layers 13r, 13g and 13b are formed in the subpixel regions formed with the hole transfer layer 12, respectively, in the same manner as described above.

For example, the blue emitting material layer 13b is formed in white and blue subpixel regions by dropping and drying a blue emitting material solution, and the red emitting material layer 13r and the green emitting material layer 13g are formed in red and green subpixel regions, respectively, by dropping and drying a red emitting material solution and a green emitting material solution.

Figure 11C:
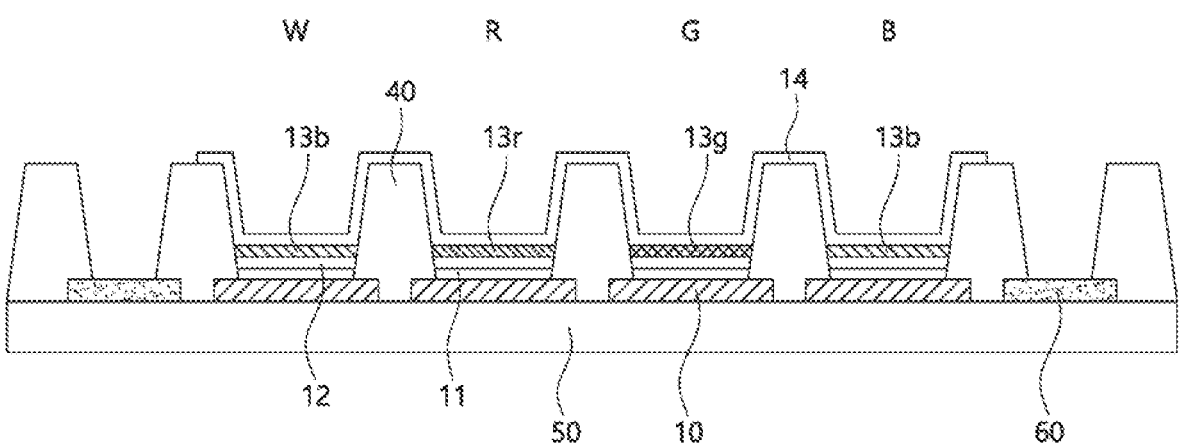

As shown in FIG. 11C, a first electron transfer layer 14 is formed on the substrate 50 formed with the red emitting material layer 13r, the green emitting material layer 13g and the blue emitting material layer 13b using a deposition process.

An electron injection layer can be further formed on the first electron transfer layer 14.

The first electron transfer layer 14 can be formed in each subpixel region, using an open mask or a shadow mask, so that the power supply line 60 is exposed.

Figure 11D:
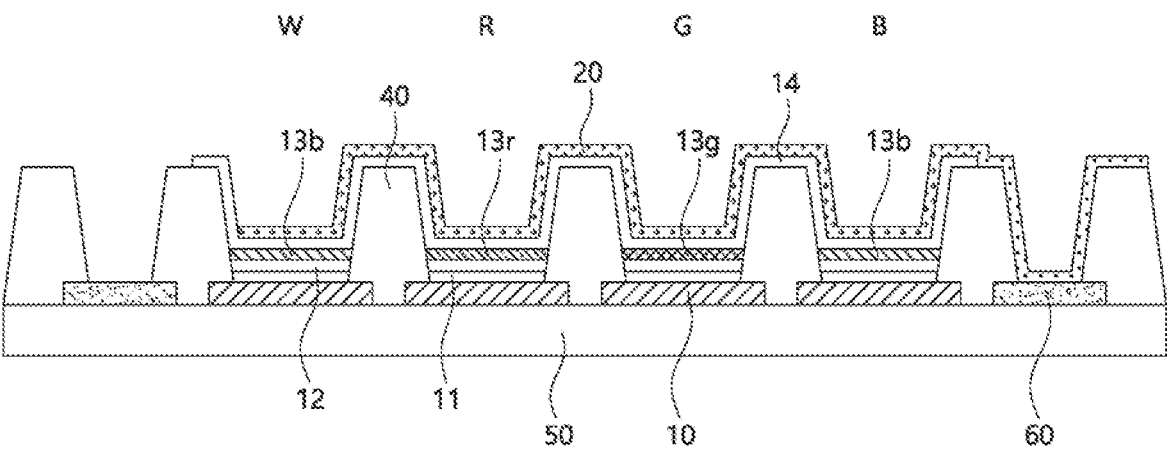

As shown in FIG. 11D, a second electrode 20 is formed on the substrate 50 formed with the first electron transfer layer 14, using a deposition process, so that the second electrode 20 is disposed on each subpixel region and the power supply line 60.

The second electrode 20 is formed by sequentially depositing a metal layer and a photoresist layer on the entire surface of the substrate 50, and then selectively removing the metal layer through a photolithography process using a patterned mask.

In this case, the second electrode 20 is electrically connected to the power supply line 60. The power supply line 60, to which the second electrode 20 is electrically connected, can be a low-level voltage (VSS) supply line shown in FIG. 10.

Figure 11E:
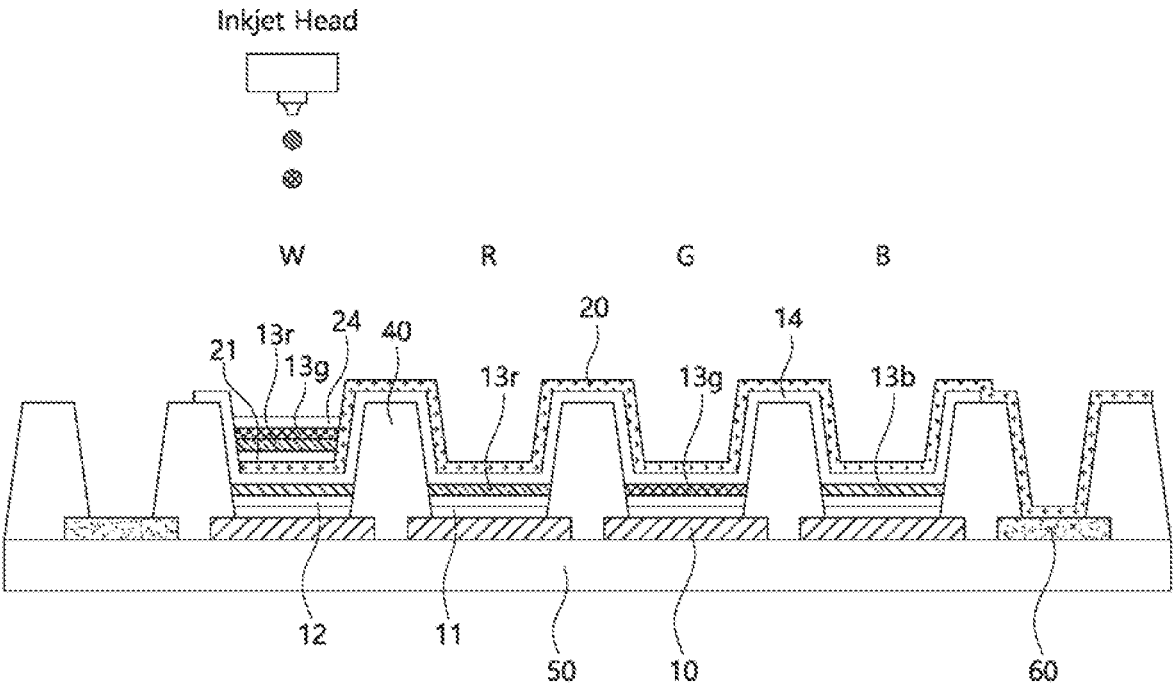

As shown in FIG. 11E, a second electron transfer emission material solution is dropped onto the white subpixel region of the substrate 50 formed with the second electrode 20, and is then dried, thereby forming a second electron transfer layer 21.

A red emitting material solution is dropped onto the second electron transfer layer 21, and is then dried, thereby forming the red emitting material layer 13r.

A green emitting material solution is dropped onto the red emitting material layer 13r, and is then dried, thereby forming the green emitting material layer 13g.

A second hole transfer emission material solution is dropped onto the green emitting material layer 13g, and is then dried, thereby form a second hole transfer layer 24.

An electron injection layer can be further formed on the second hole transfer layer 24 through an inkjet printing method.

Figure 11F:
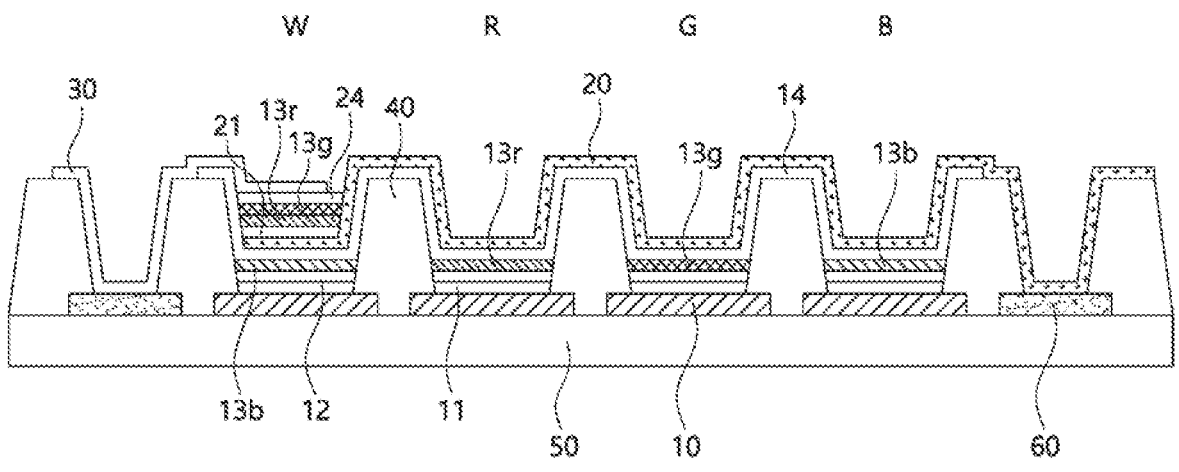

As shown in FIG. 11F, a metal layer and a photoresist layer are sequentially deposited on the entire surface of the substrate 50 formed with the second hole transfer layer 24, and the metal layer is then selectively removed through a photolithography process using a patterned mask, thereby forming a third electrode 30.

Although the third electrode 30 is shown in FIG. 11F as being directly connected to the power supply line 60, the exemplary embodiments of the present invention are not limited thereto, and the metal third electrode 30 can be connected to the power supply line 60 via a fifth driving transistor DR5, as shown in FIG. 8.

Figure 12:
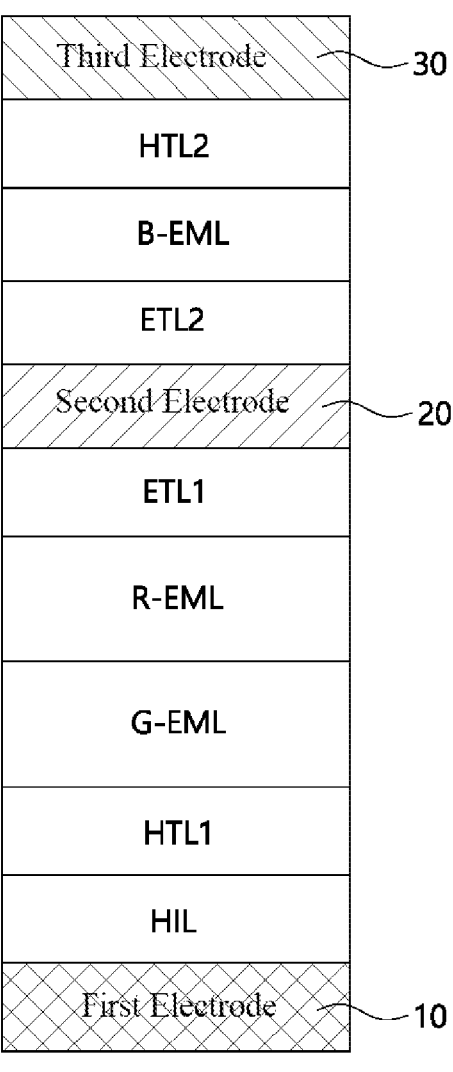
FIG. 12 is a view of a concrete configuration of a light emitting element of a white subpixel of an organic light emitting display panel according to another embodiment of the present invention.

FIG. 12 is a view of a concrete configuration of a light emitting element of a white subpixel of an organic light emitting display panel according to another embodiment of the present invention. The embodiment of the concrete configuration of the light emitting element of the white subpixel shown in FIG. 12 is different from that of FIG. 4.

Although the blue emitting material layer B-EML is shown in FIG. 4 as being driven by the first electrode 10 and the second electrode 20, the exemplary embodiments of the present invention are not limited thereto.

As shown in FIG. 12, at least one of a red emitting material layer R-EML or a green emitting material layer G-EML can be driven by a first electrode 10 and a second electrode 20. In addition, a blue emitting material layer B-EML can be driven by the second electrode 20 and a third electrode 30.

For example, the light emitting element can have a structure in which the first electrode 10, a hole injection layer HIL, a first hole transfer layer HTL1, the green emitting material layer G-EML, the red emitting material layer R-EML, a first electron transfer layer ETL1, the second electrode 20, a second electron transfer layer ETL2, the blue emitting material layer B-EML, a second hole transfer layer HTL2, and the third electrode 30 are sequentially stacked in this order.

Although the green emitting material layer G-EML and the red emitting material layer R-EML are shown as being sequentially stacked in this order between the first electrode 10 and the second electrode 20, the exemplary embodiments of the present invention are not limited thereto, and the green emitting material layer G-EML can be disposed on the red emitting material layer R-EML.

The light emitting element of the white subpixel of the organic light emitting display panel according to the other embodiment of the present invention configured as shown in FIG. 12 can be manufactured through the manufacturing method described with reference to FIGS. 11A to 11F.

For example, the hole injection layer HIL, the first hole transfer layer HTL1, the green emitting material layer G-EML, and the red emitting material layer R-EML can be formed using an inkjet printing method, the first electron transfer layer ETL1 and the second electrode 20 can be formed using a deposition method, the second electron transfer layer ETL2, the blue emitting material layer B-EML and the second hole transfer layer HTL2 can be formed using an inkjet printing method, and the third electrode 30 can be formed using a deposition method.

Thus, a light emitting element having a multi-stack structure can be manufactured through combination of an inkjet printing process and a deposition process.

Meanwhile, a unit pixel can be configured by four subpixels of white, red, green and blue, and can be disposed to have a Pentile structure.

Figure 13:
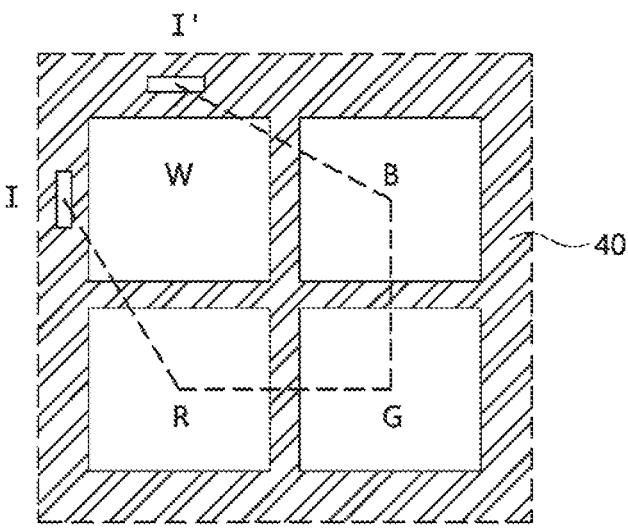
FIG. 13 is a plan view of an organic light emitting display panel according to another embodiment of the present invention.

FIG. 13 is a plan view of an organic light emitting display panel according to another embodiment of the present invention.

As shown in FIG. 13, in a unit pixel of the organic light emitting display panel according to the other embodiment of the present invention, four subpixels W, R, G and B of white, red, green and blue are disposed in the form of quadrangles. The unit pixel includes a bank layer 20 disposed in boundary portions of regions of the subpixels W, R, G and B, to surround the regions of the subpixels W, R, G and B.

In plan view, the embodiment of FIG. 2 is different from the embodiment of FIG. 13 in that the unit pixel of FIG. 2 has a stripe structure, whereas the unit pixel of FIG. 13 has a Pentile structure. The cross-sectional structure taken along line I-I' in FIG. 13 is identical to that of FIG. 3 and, as such, no description thereof will be given.

As apparent from the above description, the organic light emitting display panel according to the exemplary embodiments of the present invention achieves an enhancement in brightness because the unit pixel thereof includes a white subpixel.

In addition, a blue emitting material layer is present at each of a white subpixel and a blue subpixel and, as such, a blue emitting area increases. As a result, the blue subpixel can be driven at low current and, as such, it can be possible to reduce degradation of the blue emitting element while increasing the lifespan of the blue emitting element.

In addition, when a yellow image is driven through driving of a green emitting material layer and a red emitting material layer, an enhancement in brightness and an increase in lifespan of the element can be achieved.

The foregoing descriptions and the accompanying drawings have been presented in order to illustratively explain technical ideas of the present invention. A person skilled in the art to which the present invention pertains can appreciate that diverse modifications and variations obtained by combining, dividing, substituting for, or changing constituent elements can be possible without changing essential characteristics of the present invention. Therefore, the foregoing embodiments disclosed herein shall be interpreted as illustrative only and not as limitative of the principle and scope of the present invention. It should be understood that the scope of the present invention shall be defined by the appended claims and all of their equivalents fall within the scope of the present invention.

What is claimed is:

1. An organic light emitting display panel comprising:
a plurality of data lines and a plurality of scan lines intersecting each other; and
unit pixels disposed in the form of a matrix so that each of the unit pixels is disposed in a region where one scan line intersects five data lines,
wherein each of the unit pixels comprises white, red, green and blue subpixels, and
wherein the white subpixel is driven by one scan line among the plurality of scan lines and first and second data lines of the plurality of data lines, the white subpixel comprising:
three stacked emission material layers;

a first switching transistor controlled by a scan pulse of the one scan line, to transmit a data voltage of the first data line to a first node;

a first driving transistor configured to control current flowing through a first light emitting diode in accordance with a voltage of the first node;

a second switching transistor controlled by the scan pulse of the one scan line, to transmit a data voltage of the second data line to a third node; and a second driving transistor configured to control current flowing through second and third light emitting diodes in accordance with a voltage of the third node.

2. The organic light emitting display panel according to claim 1, wherein the white subpixel is driven by two data lines among the plurality of data lines.

3. The organic light emitting display panel according to claim 1, wherein:

the white subpixel further comprises a first electrode, a second electrode, and a third electrode; and the first electrode, a first emission material layer among the emission material layers, the second electrode, a second emission material layer among the emission material layers, a third emission material layer among the emission material layers and the third electrode are sequentially stacked in this order.

4. The organic light emitting display panel according to claim 3, wherein the first emission material layer is a blue emitting material layer, and the second and third emission material layers are red and green emitting material layers, respectively, or are green and red emitting material layers, respectively.

5. The organic light emitting display panel according to claim 1, wherein:

the white subpixel further comprises a first electrode, a second electrode, and a third electrode; and the first electrode, a second emission material layer among the emission material layers, a third emission material layer among the emission material layers, the second electrode, a first emission material layer among the emission material layers and the third electrode are sequentially stacked in this order.

6. The organic light emitting display panel according to claim 5, wherein the first emission material layer is a blue emitting material layer, and the second and third emission material layers are red and green emitting material layers, respectively, or are green and red emitting material layers, respectively.

7. The organic light emitting display panel according to claim 1, wherein:

the white subpixel further comprises a first electrode, a second electrode, and a third electrode;

a hole injection layer, a first hole transfer layer, a first emission material layer among the emission material layers and a first electron transfer layer are sequentially stacked in this order between the first electrode and the second electrode; and a second electron transfer layer, a second emission material layer among the emission material layers, a third emission material layer among the emission material layers and a second hole transfer layer are sequentially stacked in this order between the second electrode and the third electrode.

8. The organic light emitting display panel according to claim 7, wherein:

the hole injection layer, the first hole transfer layer, the first emission material layer, the second electron transfer layer, the second emission material layer, the third emission material layer and the second hole transfer layer are formed through an inkjet printing method; and the second electron transfer layer, the second electrode and the third electrode are formed through a deposition process.

9. The organic light emitting display panel according to claim 7, wherein the first emission material layer is a blue emitting material layer, and the second and third emission material layers are red and green emitting material layers, respectively, or are green and red emitting material layers, respectively.

10. The organic light emitting display panel according to claim 1, wherein:

the white subpixel further comprises a first electrode, a second electrode, and a third electrode;

a hole injection layer, a first hole transfer layer, a second emission material layer among the emission material layers, a third emission material layer among the emission material layers and a first electron transfer layer are sequentially stacked in this order between the first electrode and the second electrode; and a second electron transfer layer, a first emission material layer among the emission material layers and a second hole transfer layer are sequentially stacked in this order between the second electrode and the third electrode.

11. The organic light emitting display panel according to claim 10, wherein:

the hole injection layer, the first hole transfer layer, the second emission material layer, the third emission material layer, the second electron transfer layer, the first emission material layer and the second hole transfer layer are formed through an inkjet printing method; and the first electron transfer layer, the second electrode and the third electrode are formed through a deposition process.

12. The organic light emitting display panel according to claim 10, wherein the first emission material layer is a blue emitting material layer, and the second and third emission material layers are red and green emitting material layers, respectively, or are green and red emitting material layers, respectively.

13. The organic light emitting display panel according to claim 1, wherein:

the white subpixel further comprises:

a first capacitor configured to store the data voltage supplied to the first node for one frame; and a second capacitor configured to store the data voltage supplied to the third node for one frame; and the first light emitting diode is connected between the first driving transistor and a low-level voltage supply line, and the second and third light emitting diodes are connected in a forward direction between the second driving transistor and the low-level voltage supply line.

* * * * *